United States Patent
Holland

(10) Patent No.: US 9,293,542 B2
(45) Date of Patent: Mar. 22, 2016

(54) METHODS OF FORMING SEMICONDUCTOR DEVICES AND FINFETS

(71) Applicant: Taiwan Semiconductor Manufacturing Company, Ltd., Hsin-Chu (TW)

(72) Inventor: Martin Christopher Holland, Bertem (BE)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 78 days.

(21) Appl. No.: 14/202,928

(22) Filed: Mar. 10, 2014

(65) Prior Publication Data

US 2015/0255548 A1 Sep. 10, 2015

(51) Int. Cl.
| | |
|---|---|
| *H01L 33/00* | (2010.01) |
| *H01L 29/267* | (2006.01) |
| *H01L 21/76* | (2006.01) |
| *H01L 21/02* | (2006.01) |
| *H01L 27/12* | (2006.01) |
| *H01L 29/04* | (2006.01) |
| *H01L 21/311* | (2006.01) |
| *H01L 29/06* | (2006.01) |
| *H01L 29/66* | (2006.01) |
| *H01L 21/762* | (2006.01) |
| *H01L 29/775* | (2006.01) |
| *H01L 29/778* | (2006.01) |
| *H01L 29/205* | (2006.01) |

(52) U.S. Cl.
CPC ........ *H01L 29/267* (2013.01); *H01L 21/02043* (2013.01); *H01L 21/0243* (2013.01); *H01L 21/0262* (2013.01); *H01L 21/02063* (2013.01); *H01L 21/02378* (2013.01); *H01L 21/02381* (2013.01); *H01L 21/02538* (2013.01); *H01L 21/311* (2013.01); *H01L 21/76* (2013.01); *H01L 21/76224* (2013.01); *H01L 27/1211* (2013.01); *H01L 29/045* (2013.01); *H01L 29/0649* (2013.01); *H01L 29/205* (2013.01); *H01L 29/66462* (2013.01); *H01L 29/66795* (2013.01); *H01L 29/775* (2013.01); *H01L 29/7781* (2013.01); *H01L 21/02639* (2013.01)

(58) Field of Classification Search
USPC .......................................................... 257/102
See application file for complete search history.

(56) References Cited

U.S. PATENT DOCUMENTS

| | | | | |
|---|---|---|---|---|
| 2010/0261340 | A1* | 10/2010 | Nijhawan et al. | 438/478 |
| 2010/0301390 | A1* | 12/2010 | Ko et al. | 257/190 |
| 2013/0130481 | A1* | 5/2013 | Chua et al. | 438/493 |

OTHER PUBLICATIONS

Tomioka, K., et al., "Growth of Highly Uniform InAs Nanowire Arrays by Selective-Area MOVPE," Journal of Crystal Growth 298 (2007) pp. 644-647.
Tomioka, K., et al., "Control of InAs Nanowire Growth Directions on Si," Nano Letters 2008, vol. 8, No. 10, pp. 3475-3480.

(Continued)

*Primary Examiner* — Long K Tran
(74) *Attorney, Agent, or Firm* — Slater & Matsil, L.L.P.

(57) ABSTRACT

Methods of forming semiconductor devices and fin field effect transistors (FinFETs) are disclosed. In some embodiments, a method of forming a semiconductor device includes forming a group III material over a substrate, the group III material comprising a thickness of about 2 monolayers or less. The method includes forming a group III-V material over the group III material.

20 Claims, 7 Drawing Sheets

(56) References Cited

OTHER PUBLICATIONS

Heyns, M. et al., "Advancing CMOS beyond the Si roadmap with Ge and III/V devices," IEEE, Electron Devices Meeting (IEDM), Dec. 5-7, 2011, pp. 13.1.1-13.1.4.

Kawabe, Mitsuo et al., "Self-Annihilation of Antiphase Boundary in GaAs on Si(100) Grown by Molecular Beam Epitaxy," Japanese Journal of Applied Physics, vol. 26, No. 6, Jun. 1987, pp. L944-L946.

Kitahara, Kuninori et al,. "Observation of Atomic Structure by Scanning Tunneling Microscopy of Vicinal Si(100) Surface Annealed in Hydrogen Gas," Japanese Journal of Applied Physics, vol. 33, Part 2, No. 11B, Nov. 15, 1994, pp. L1571-L1573.

Kotlyar, V.G., et al., "Magic Nanoclusters of Group III Metals on Si(100) Surface," e-J. Surf. Sci. Nanotech, vol. 1 (2003), pp. 33-40.

Matthews, J.W. et al., "Defects in Epitaxial Multilayers," Journal of Crystal Growth, Mar. 27, 1974, North-Holland Publishsing Co., pp. 118-125.

Radosavljevic, M et al., "Non-Planar, Multi-Gate InGaAs Quantum Well Field Effect Transistors with High-K Gate Dielectric and Ultra-Scaled Gate-to-Drain/Gate-to-Source Separation in Low Power Logic Applications," IEEE, Electron Devices Meeting (IEDM), Dec. 6-8, 2010, pp. 6.1.1-6.1.4.

Radosavljevic, M. et al., "Electrostatics Improvement in 3-D Tri-gate Over Ultra-Thin Body Planar InGaAs Quantum Well Field Effect Transistors with High-K Gate Dielectric and Scaled Gate-to-Drain/Gate-to-Source Separation," IEEE, Electron Devices Meeting (IEDM), Dec. 5-7, 2011, pp. 33.1.1-33.1.4.

Van Dal, M.J.H. et al., "Demonstration of scaled Ge p-channel FinFETs integrated on Si," IEEE, Electron Devices Meeting (IEDM), Dec. 10-13, 2012, pp. 23.5.1-23.5.4.

Varrio, J., et al., "Model of Growth of Single-Domain GaAs Layers on Double-Domain Si Substrates by Molecular Beam Epitaxy," Appl. Phys. Lett., vol. 55, Issue 19, 1989, pp. 1987-1989.

\* cited by examiner

US 9,293,542 B2

METHODS OF FORMING SEMICONDUCTOR DEVICES AND FINFETS

PRIORITY CLAIM AND CROSS-REFERENCE

This application is related to U.S. patent application Ser. No. 13/895,134, filed on May 15, 2013, entitled "Methods for Forming Semiconductor Materials in STI Trenches," which application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. The semiconductor industry continues to improve the integration density of various electronic components (e.g., transistors, diodes, resistors, capacitors, etc.) by continual reductions in minimum feature size, which allow more components to be integrated into a given area.

Multiple gate field-effect transistors (MuGFETs) are a recent development in semiconductor technology which typically are metal oxide semiconductor FETs (MOSFETs) that incorporate more than one gate into a single device. One type of MuGFET is referred to as a fin-FET (FinFET), which is a transistor structure with a fin-like semiconductor channel that is raised vertically out of the silicon surface of an integrated circuit.

Compound semiconductor materials of group III and group V elements (known as III-V compound semiconductors) are good candidates for forming transistors due to their high electron mobility. Therefore, transistors formed from III-V compound semiconductors have been explored.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
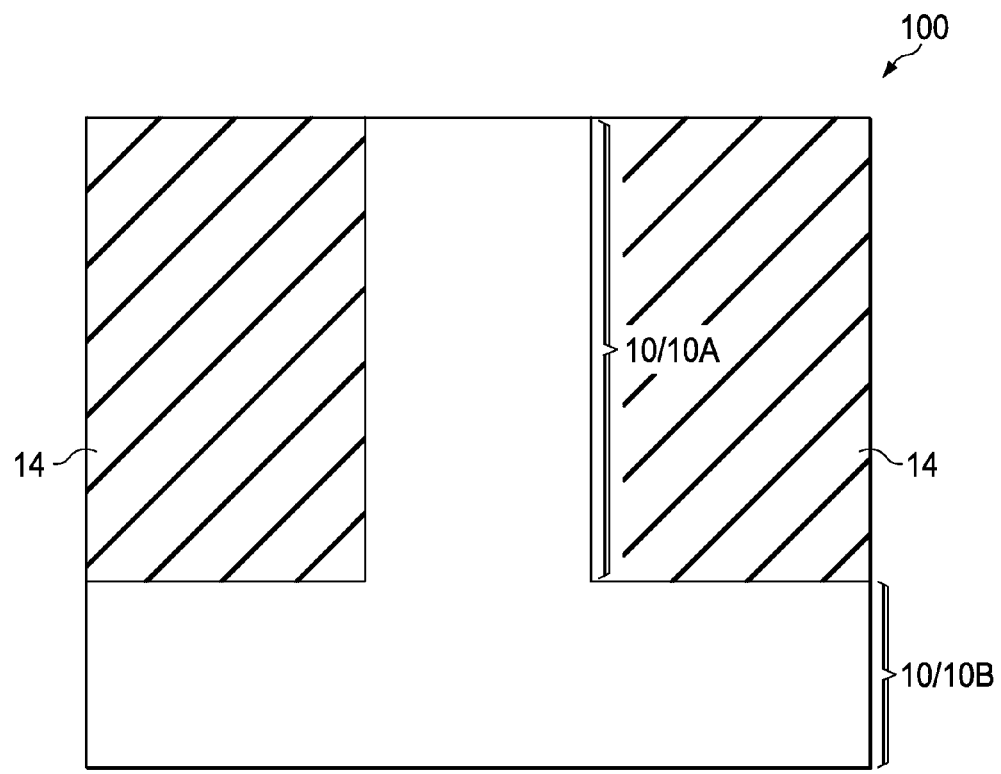
FIGS. 1 through 6 illustrate cross-sectional views of a method of forming a fin field effect transistor (FinFET) at various stages of manufacturing in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the present disclosure provide novel methods of forming semiconductor devices and FinFETs, and structures thereof. In some embodiments, a seed layer is formed by first, forming a thin nucleation layer comprising a group III material over a substrate, and second, growing a group III-V layer from the group III material. A channel region of a transistor is then grown from the novel seed layer.

FIGS. 1 through 6 illustrate cross-sectional views of a method of forming a fin field effect transistor (FinFET) at various stages of manufacturing in accordance with some embodiments of the present disclosure. Referring first to FIG. 1, a semiconductor device 100 is shown that includes a substrate 10. To manufacture the semiconductor device 100, first, the substrate 10 is provided. The substrate 10 is part of a semiconductor wafer in some embodiments; e.g., a plurality of semiconductor devices 100 are fabricated on a semiconductor wafer, and the wafer is later singulated along scribe lines. Only one FinFET is shown in each of the drawings; however, a semiconductor device 100 may include dozens, hundreds, or thousands of FinFETs formed across a surface thereon, in some embodiments, for example.

The substrate 10 may include a semiconductor substrate comprising silicon (Si) or other semiconductor materials and may, or may not be, covered by an insulating layer, for example. The substrate 10 may include active components or circuits, not shown. The substrate 10 may comprise silicon oxide over single-crystal silicon, for example. The substrate 10 may include conductive layers or semiconductor elements, e.g., transistors, diodes, etc., formed therein. The substrate 10 may comprise a single-crystalline Si or germanium (Ge) substrate in some embodiments. In some embodiments, the substrate 10 comprise Si oriented in a (0,0,1) crystalline orientation, as an example. Compound semiconductors such as GaAs, InP, SiGe, or SiC, as examples, may be used in place of Si or Ge. The substrate 10 may comprise a bulk substrate or a semiconductor-on-insulator (SOI) substrate, for example. Alternatively, the substrate 10 may comprise other materials and crystalline orientations.

A plurality of isolation regions such as shallow trench isolation (STI) regions 14 are formed in the substrate 10. The isolation regions may comprise other types of isolation structures, such as field oxide regions, for example. The substrate 10 thus includes region 10A disposed between two of the STI regions 14, and region 10B disposed under or beneath the STI regions 14. The formation process of the STI regions 14 may include etching the substrate 10 to form recesses (which are occupied by STI regions 14 in FIG. 1), filling the recesses with a dielectric material(s) such as silicon oxide, silicon nitride, other insulating materials, or combinations or multiple layers thereof, and performing a planarization process to remove excess dielectric material from the top surface of the substrate 10. The remaining portions of the dielectric material(s) left residing in the recesses form the STI regions 14.

Figure 2:
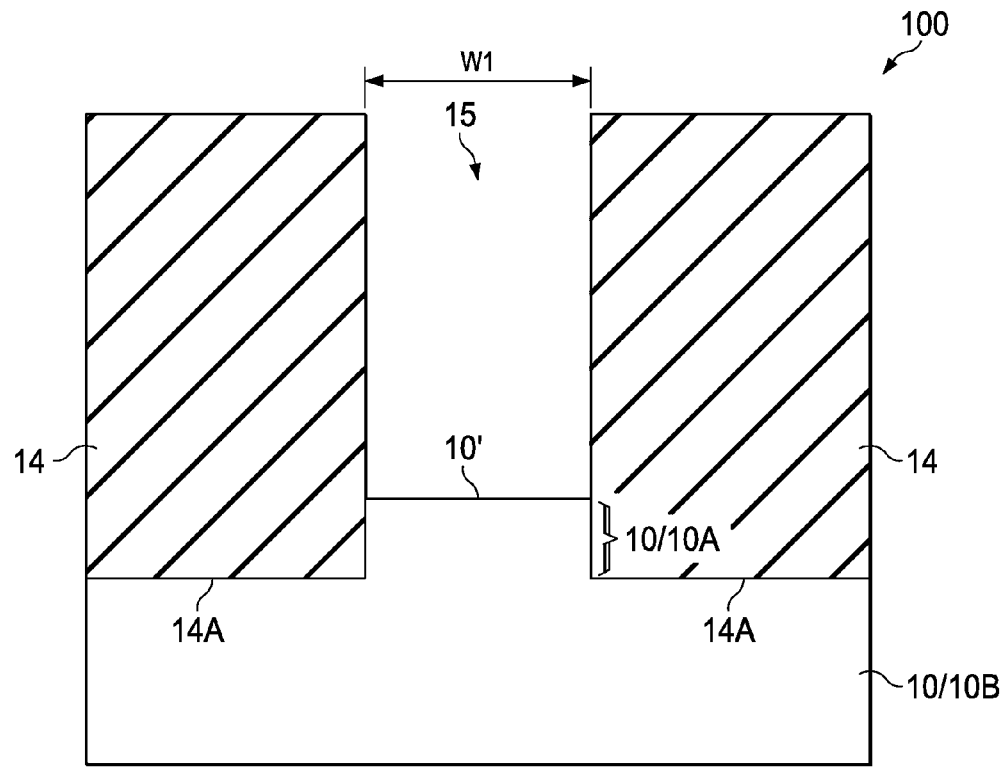

Next, as shown in FIG. 2, a portion of the substrate 10 between two of the STI regions 14 is recessed. For example, a top portion of region 10A of substrate 10 is removed, which region 10A is disposed between opposite sidewalls of the two STI regions 14. The top portion of region 10A is removed using an etch process to form a trench 15. In some embodiments, a top surface 10' of the substrate 10, which top surface 10' is exposed to the trench 15, is substantially level with bottom surfaces 14A of the STI regions 14. In alternative embodiments, the top surface 10' of region 10A of the substrate 10 is higher than or lower than the bottom surfaces 14A of the STI regions 14 after the etch process used to form the trench 15. The etch process may be performed using a dry etch, with the etching gas being selected from $CF_4$, $Cl_2$, $NF_3$, $SF_6$, and/or combinations thereof. In alternative embodiments, the etch process may be performed using wet etching, for example, using Tetra-Methyl Ammonium Hydroxide (TMAH), a potassium hydroxide (KOH) solution, or the like, as an etchant. In the resulting structure, the trench 15 may have a width W1 that comprises about 150 nm or less, for example. Alternatively, the width W1 may comprise other values. In some embodiments, the width W1 of the trench 15 may be between about 10 nm and about 100 nm. It is appreciated, however, that the values recited throughout the description are merely examples, and may be changed to different values.

In some embodiments, after region 10A of the substrate 10 is recessed, the substrate 10 is annealed. In some embodiments, an annealing process is performed with the substrate 100 being at a temperature lower than about 870 degrees C., for example. Advantageously, by using the annealing temperature below about 870 degrees C., the wafer of the semiconductor device 100 will not bow (with significant warpage) after annealing. The annealing temperature of substrate 10 may also be higher than about 400 degrees C., and lower than about 800 degrees C., or lower than about 750 degrees C. In some exemplary embodiments, the annealing temperature is between about 700 degrees C. and about 725 degrees C. The annealing process may be performed for a period of time between about 1 minute and about 10 minutes, although a longer or a shorter time period may be used. Alternatively, the substrate 10 may be annealed at other temperatures and time durations.

In some embodiments, the substrate 10 is annealed in the presence of hydrogen chloride (HCl) and hydrogen ($H_2$). For example, the annealing process may be performed in a process chamber (not shown), with a process gas comprising HCl and $H_2$ being introduced into the chamber during the annealing process. The chamber comprises a metal oxide chemical vapor deposition (MOCVD) chamber in accordance with some embodiments, for example. Other types of chambers may also be used. During the annealing process, the flow rate of $H_2$ may be higher than the flow rate of HCl. For example, the flow rate of $H_2$ may be between about 500 sccm and about 50,000 sccm. The flow rate of HCl may be between about 5 sccm and about 200 sccm. Alternatively, the $H_2$ and HCl flow rates may comprise other values. Annealing silicon in $H_2$ may cause the migration of silicon atoms at the top surface 10' of silicon region 10A to form double steps, as described in the related patent application Ser. No. 13/895,134, filed on May 15, 2013, entitled "Methods for Forming Semiconductor Materials in STI Trenches". In addition, the introduction of HCl during the annealing process further promotes the migration of silicon atoms, so that the formation of double steps may be achieved at the lower temperatures of the anneal process, rather than higher temperatures higher than 870 degrees C. Accordingly, as a result of the annealing, the top surface 10' of region 10A of the substrate 10 is converted from a single-step surface to a double-step surface, and hence the amount of anti-phase domain defects in the subsequent epitaxial formed layers may be substantially eliminated, or at least reduced, in accordance with some embodiments. In other embodiments, the substrate 10 is not annealed in the presence of HCl and $H_2$.

The anneal process prepares the surface 10' of region 10A of the substrate 10. After the anneal process, the temperature of the substrate 10 is lowered to a temperature of about 300 degrees C. to about 400 degrees C., in some embodiments.

Figure 3:
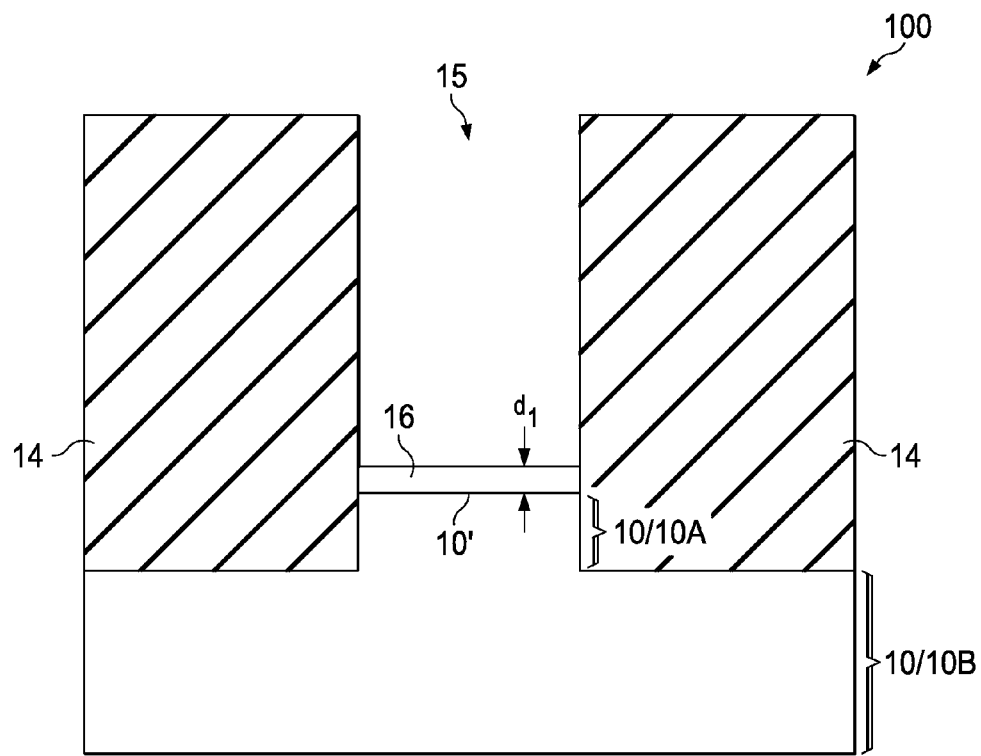

Referring next to FIG. 3, a group III material 16 is formed over region 10A of the substrate 10. The group III material 16 is formed in the recessed portion of the substrate 10 between the two STI regions 14, e.g., within the trench 15. The group III material 16 comprises Ga, In, or Al, for example. The group III material 16 comprises a thickness comprising dimension $d_1$ of about 2 monolayers or less in accordance with some embodiments. Dimension $d_1$ comprises about 0.5 monolayers to about 2 monolayers in some embodiments. In other embodiments, dimension $d_1$ comprises about 0.1 monolayers to about 1.5 monolayers. In some embodiments, dimension $d_1$ comprises about one monolayer, as another example. The group III material 16 comprises about 2 monolayers or less of the group III material 16 atoms, for example. Alternatively, the group III material 16 may comprise other materials and dimensions.

The group III material 16 is formed by introducing a group III precursor into the chamber that the semiconductor device 100 is being processed in. The precursor may comprise a material such as trimethyl indium (TMIn), triethyl gallium (TEGa), trimethyl gallium (TMGa), trimethyl aluminum (TMAl), tritertiarybutylaluminum (TTBAl), and/or combinations thereof, as examples. The precursor may be introduced at a flow rate of from about 10 standard cubic centimeters per second (sccm) to about 150 sccm, for example. The group III precursor may be introduced for a time period of about 1 second to about 20 seconds, for example. Alternatively, the group III material 16 may be formed using other group III precursors, flow rates, and time periods of introduction.

In some embodiments, introducing the group III precursor comprises exposing the surface 10' of the substrate 10 to a group III flux, for example. In some embodiments, introducing the group III precursor results in an MOCVD formation of the group III material 16, for example.

The group III material 16 comprises a nucleation layer that greatly increases a range of growth conditions that may be used in a subsequent formation process for a group III/V material 18 (see FIG. 4), which advantageously allows the group III/V material 18 to be grown with a lower defect density. The thin layer of the group III material 16 reduces a V/III ratio (e.g., of group V and group III precursor materials) required to form the group III/V material 18. The group III material 16 promotes nucleation of the group III/V material 18 on the substrate 10 surface 10'. The group III material 16 comprises a pre-layer for the formation of the group III/V material 18 in some embodiments, for example.

Figure 4:
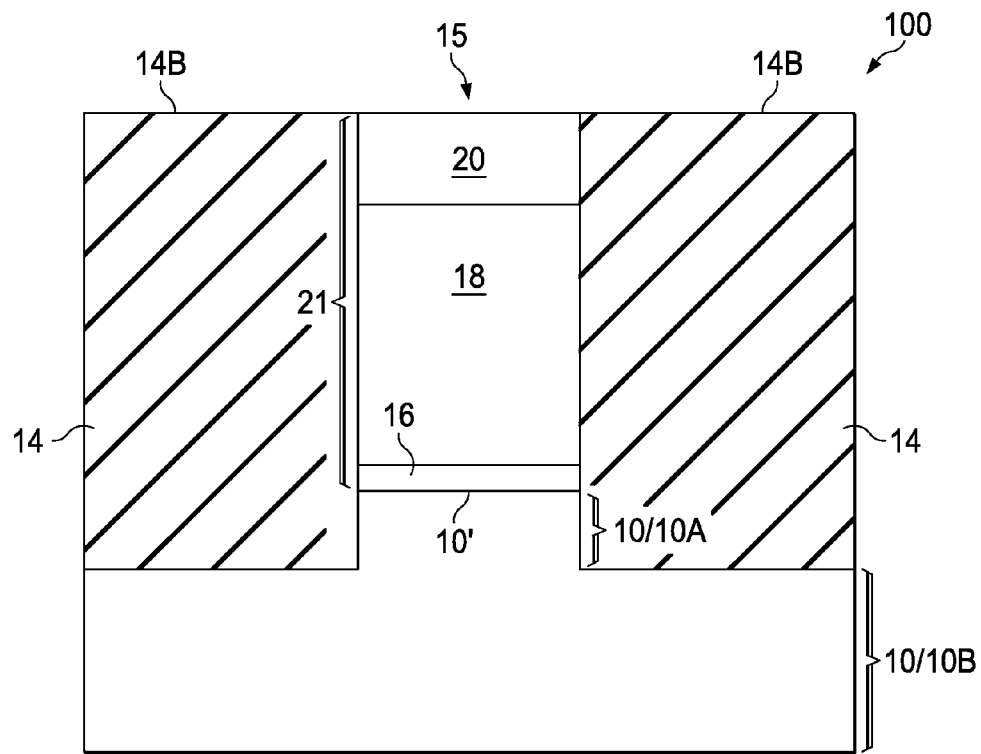

Referring next to FIG. 4, a group III-V material 18 is formed over the group III material 16. The group III-V material 18 comprises a group III material combined with a group V material. In some embodiments, the group III-V material 18 includes the same group III material of the group III material 16, for example. In other embodiments, the group III-V material 18 includes a different group III material than a group III material of the group III material 16. The group III-V material 18 comprises InAs, GaAs, AlAs, InP, GaP, AlP, InSb, GaSb, AlSb, or other group III-V compound materials, as examples. The group III-V material 18 may comprise any group III-V compound material in some embodiments, for example. The group III-V material 18 comprises a thickness of about 2 nm to about 100 nm, for example. Alternatively, the group III-V material 18 may comprise other materials and dimensions.

The group III-V material 18 is formed over the group III material 16 within the trench 15 by continuing to introduce the group III precursor into the chamber, and introducing a group V precursor into the same chamber, in some embodiments. In other embodiments, the group III precursor is discontinued for a predetermined time period, and then the group III precursor and the group V precursor are substantially simultaneously introduced into the chamber. The group V precursor is introduced into the same chamber in which the group III material 16 was formed on the semiconductor device 100, for example. The same precursor used to form the group III material 16 may be used to form the group III-V material 18, or a different precursor used to form the group III material 16 may be used to form the group III-V material 18, for example.

The group V material used for growth of the group III-V material 18 may comprise As, P, Sb, or other materials, as examples. The group V precursor may comprise a material such as tributyl arsenic (TBAs), arsine ($AsH_3$), phosphine ($PH_3$), tributyl phosphorus (TBP), trimethyl antimony (TMSb), triethyl antimony (TESb), and/or a combination thereof, as examples. The group V precursor may be introduced at a flow rate of about 20 sccm to about 500 sccm, for example. The group V precursor may be introduced for a time period of about 5 seconds to about 1,200 seconds, for example. Alternatively, the group III-V material 18 may be formed using other group V precursors, flow rates, and time periods of introduction. In some embodiments, introducing the group III precursor and the group V precursor results in epitaxial growth of the group III-V material 18 from the group III material 16, for example.

In some embodiments, the group III-V material 18 may include defects caught by aspect ratio trapping (ART). Advantageously, the group III-V material 18 comprises a lower defect density due the underlying group III material 16 nucleation layer.

The group III-V material 18 functions as a seed layer for epitaxial growth of a subsequently formed material layer. In some embodiments, both the group III material 16 and the group III-V material 18 function as a seed layer for epitaxial growth of the subsequently formed material layer, for example. In some embodiments, the group III material 16 and/or the group III-V material 18 function as a seed layer for epitaxial growth of the subsequently formed channel material. The channel material comprises a channel region of transistor, for example.

For example, FIG. 4 illustrates a channel material 20 disposed over the group III-V material 18 within the trench 15. In some embodiments, precursors are introduced into the chamber so that the channel material 20 is epitaxially grown from the group III-V material 18, for example. The channel material 20 may comprise about 2 nm to about 500 nm of a conductive or semiconductive material in some embodiments, such as any III/V binary, ternary, or quaternary semiconductor material that includes In, Ga, and/or Al as the group III material and As, P, and/or Sb as the group V material, as examples. Some precursors used to epitaxially grow the channel material 20 include TMIn, TEGa, TMGa, TMAl, TTBAl, TBAs, $AsH_3$, $PH_3$, TBP, TMSb, TESb, and/or combinations thereof, as examples. Alternatively, the channel material 20 may comprise other dimensions and materials, and may be formed using other precursors. The channel material 20 is substantially defect-free in accordance with some embodiments, due to the improved seed layer comprising the group III material 16 and the group III-V material 18.

The group III material 16, the group III-V material 18, and the channel material 20 comprise a semiconductor region 21 that is epitaxially grown within the trench 15 disposed between the STI regions 14 in some embodiments.

The epitaxial growth of the channel material 20 may be continued until the top surface of semiconductor region 21 is higher than top surfaces 14B of the STI regions 14 in some embodiments. A planarization is then performed. The planarization may comprise a chemical mechanical polish (CMP) or other process. The planarization may be continued until no portion of the channel material 20 is left overlapping the STI regions 14 (e.g., until the top surface of the channel material 20 is coplanar with the top surface 14B of the STI regions 14). In alternative embodiments, the epitaxy process is stopped when the top surface of channel material 20 is substantially level with, or lower than, the top surfaces 14B of the STI regions 14. In these embodiments, the planarization step may be skipped, or may be performed.

Figure 5:
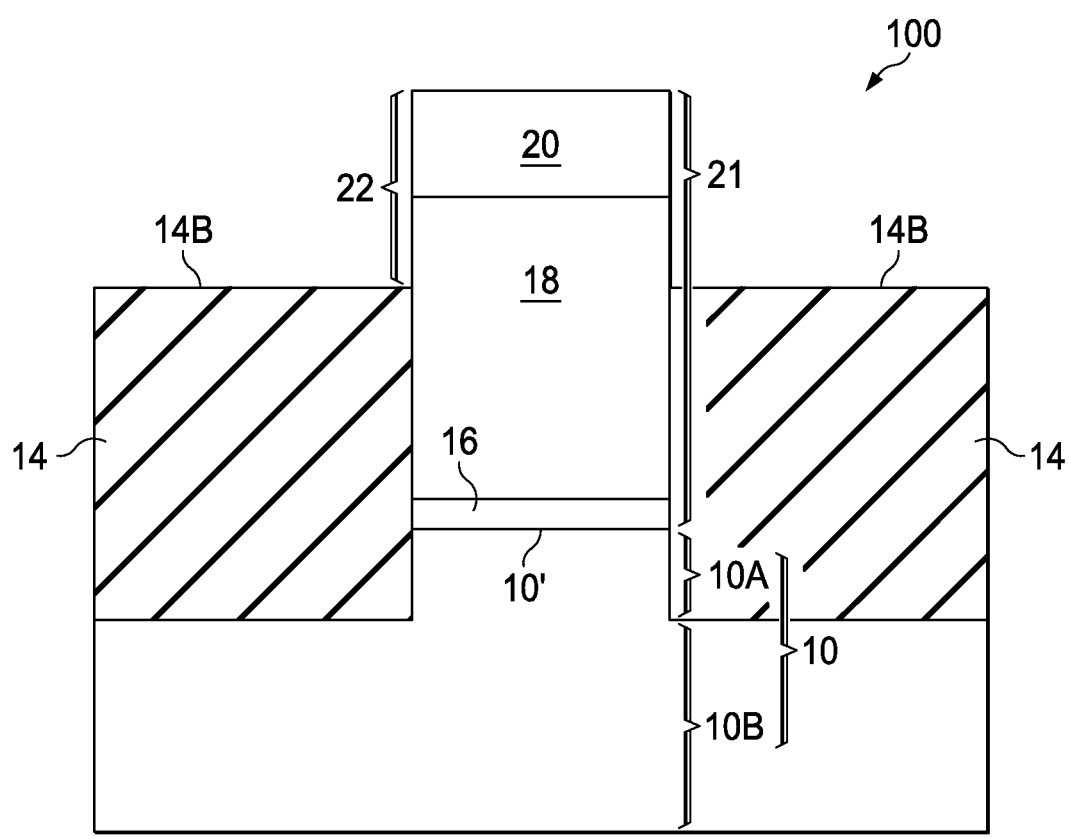
Figure 6:
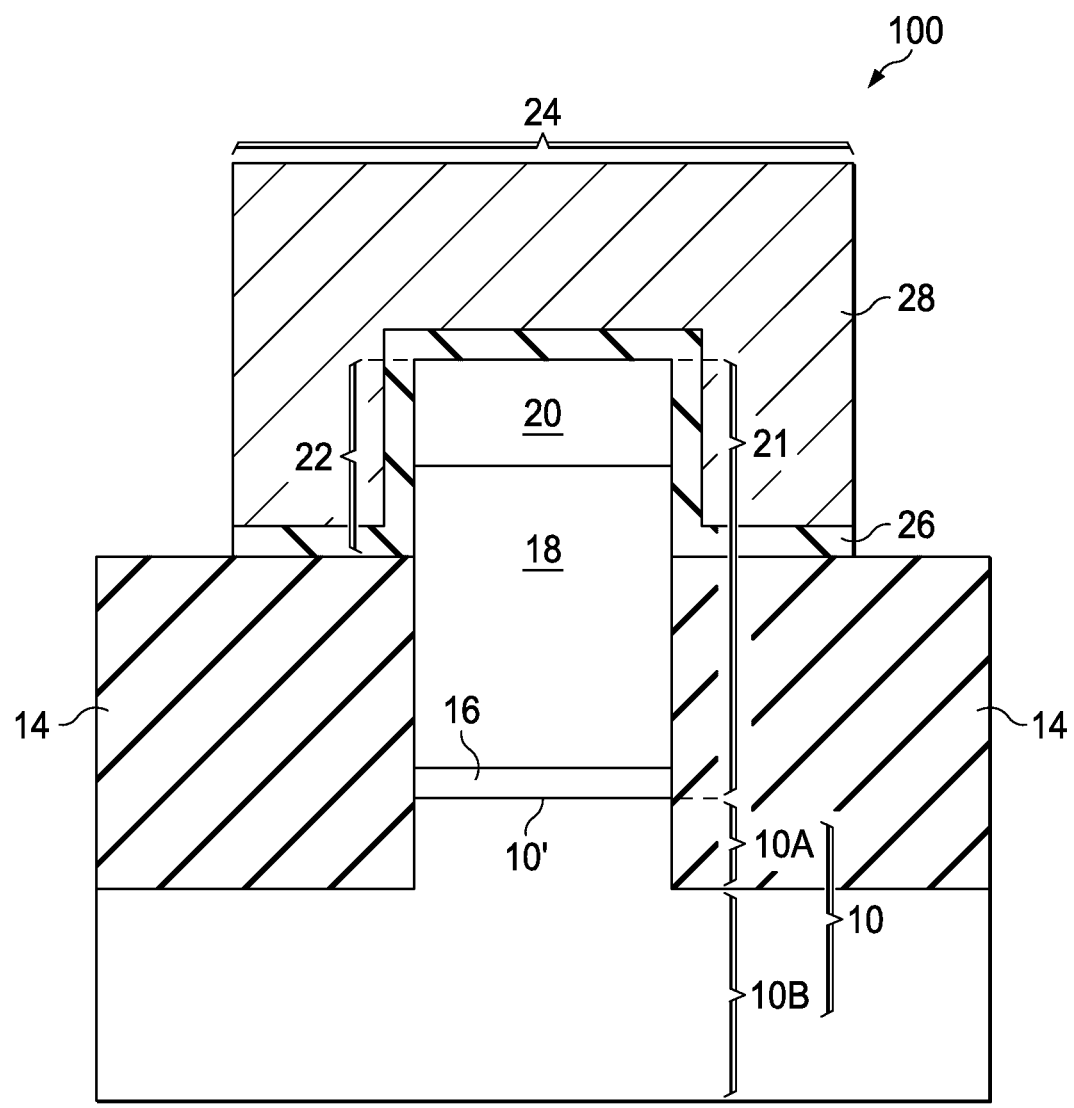

Referring next to FIG. 5, the STI regions 14 are recessed, for example, using an etching process. A portion of the semiconductor region 21 is thus higher than the top surfaces 14B of the STI regions 14. The channel material 20 and a portion of the group III-V material 18 is higher than the top surfaces 14B of the STI regions 14 in FIG. 5, for example. This portion of the semiconductor region 21 forms a semiconductor fin 22, which may be used to form a FinFET 24, as shown in FIG. 6. In some embodiments, at least a portion of the channel material 20 over top surfaces 14B of remaining portions of the STI regions 14 forms a semiconductor fin 22, for example.

Referring to FIG. 6, a gate dielectric 26 and a gate electrode 28 are formed. The gate dielectric 26 is formed on sidewalls and a top surface of the semiconductor fin 22. The gate dielectric 26 may be formed of a dielectric material such as silicon oxide, silicon nitride, an oxynitride, multi-layers thereof, and combinations thereof. The gate dielectric 26 may also comprise a high dielectric constant (high-k) dielectric material. Some exemplary high-k materials may have k values of greater than about 4.0, or greater than about 7.0. The gate electrode 28 is formed over the gate dielectric 26. The gate electrode 28 may be formed of doped polysilicon, metals, metal nitrides, metal silicides, and the like. The bottom ends of the gate dielectric 26 may contact the top surface of STI regions 14. The gate electrode 28 and the gate dielectric 26 may be patterned using a lithography process. After the formation of the gate dielectric 26 and the gate electrode 28, source and drain regions (not shown in the illustrated plane) may be formed to finish the formation of the FinFET 24.

The FinFET 24 advantageously has improved device performance due to the substantially defect-free channel material 20 formed using the seed layer comprising the group III material 16 and the group III-V material 18.

Referring again to FIG. 3, in some embodiments, the substrate 10 comprises a non-polar semiconductor material, and a polar semiconductor material is formed over the substrate 10. For example, the substrate 10 may comprise a non-polar semiconductor material such as Si, Ge, or other materials. The polar semiconductor material may include a compound of a group III material and a group V material, for example. The polar semiconductor material may comprise a group III material 16 which comprises a first component of the polar semiconductor material. The first component comprises a thickness of about 2 monolayers or less. The polar semiconductor material includes a first component and a second component of the polar semiconductor material disposed over the group III material 16. For example, the first component and the second component comprise a group III-V material 18 in some embodiments. The first component comprises a group III material, and the second component comprises a group V material, in some embodiments. Alternatively, the first component and the second component may comprise other materials.

Figure 7:
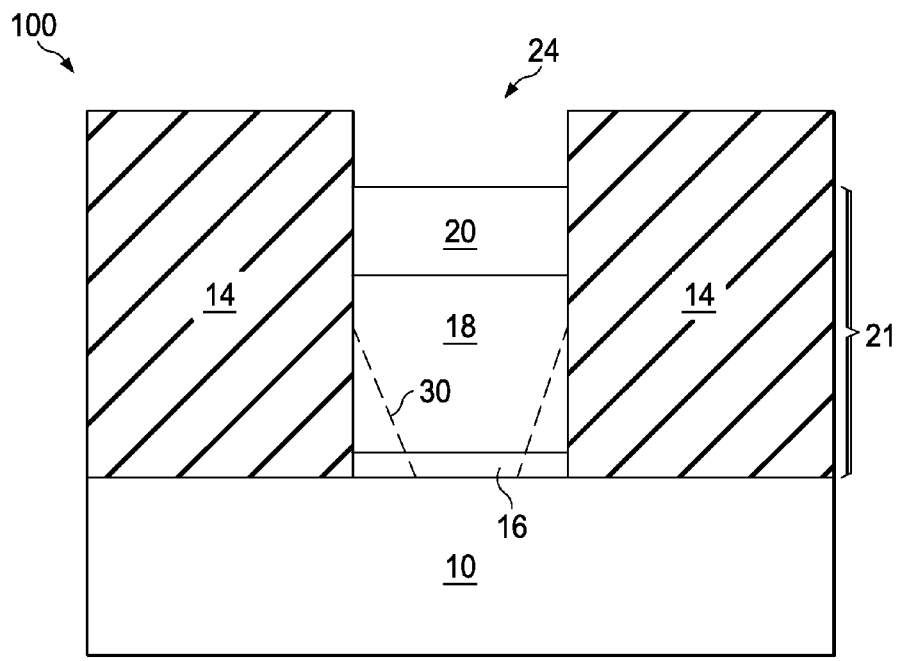
FIG. 7 is a cross-sectional view of a semiconductor device including a FinFET in accordance with some embodiments.
Figure 8:
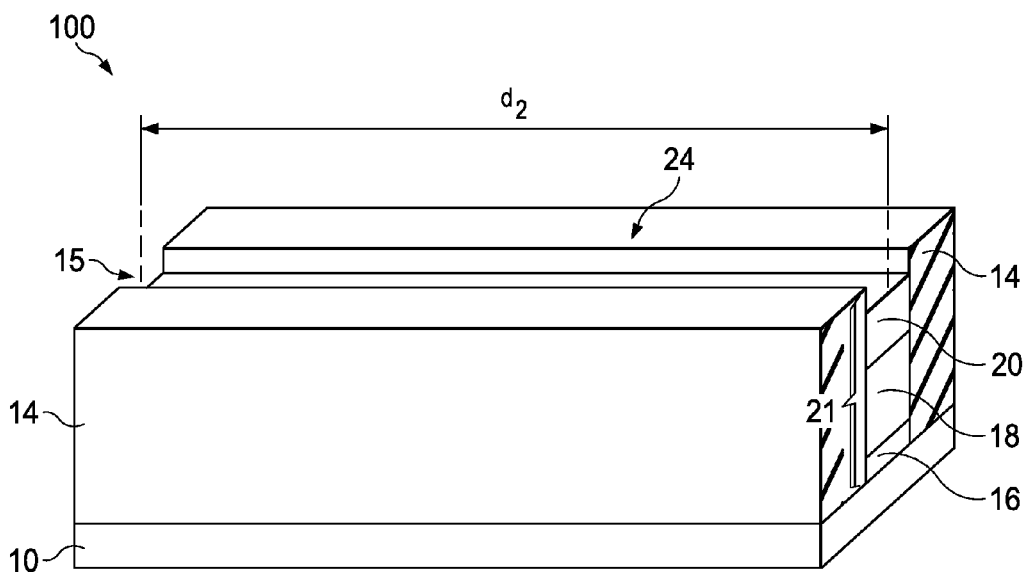
FIG. 8 is a perspective view of the semiconductor device shown in FIG. 7 in accordance with some embodiments.

FIG. 7 is a cross-sectional view of a semiconductor device 100 including a FinFET 24 in accordance with some embodiments after the manufacturing process step shown in FIG. 4 (e.g., in embodiments wherein the channel material 20 top surface is formed to a level below a top surface of the STI regions 14). Region 30 illustrates an area within the semiconductor device 100 wherein some defects caught by ART antiphase domain defects (APDs) are eliminated in accordance with some embodiments, resulting in the substantially defect-free channel material 20. FIG. 8 is a perspective view of the semiconductor device 100 shown in FIG. 7 in accordance with some embodiments. The trench 15 comprises a length comprising dimension $d_2$ in some embodiments, wherein dimension $d_2$ comprises about 1 μm or less in some embodiments. Alternatively, dimension $d_2$ may comprise other values.

Figure 9:
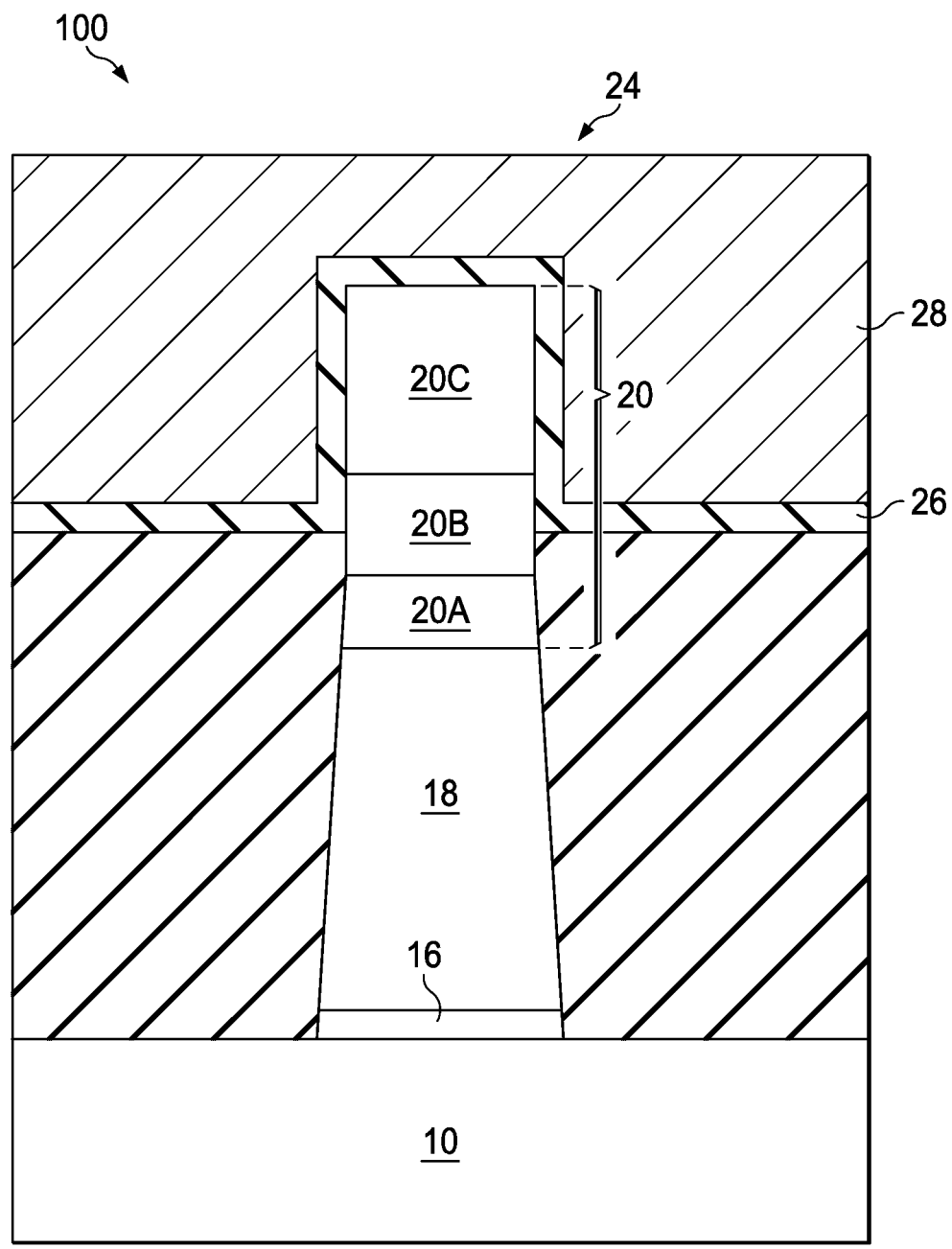
FIG. 9 is a cross-sectional view of a semiconductor device including a FinFET in accordance with some embodiments.

FIG. 9 is a cross-sectional view of a semiconductor device 100 including a FinFET 24 in accordance with some embodiments. The channel material 20 may include a plurality of material layers 20A, 20B, and 20C in accordance with some embodiments. Material layers 20A, 20B, and 20C may comprise different materials and are adapted to achieve predetermined properties for the overall channel material 20 of in the FinFET 24, for example.

Figure 10:
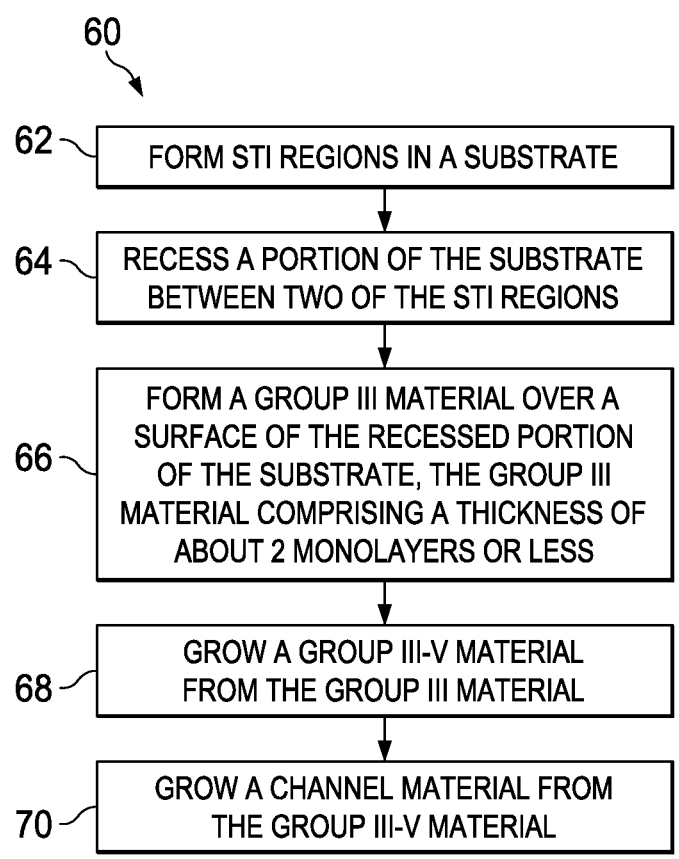
FIG. 10 is a flow chart of a method of manufacturing a semiconductor device in accordance with some embodiments.

FIG. 10 is a flow chart 60 of a method of manufacturing a FinFET 24 in accordance with some embodiments. In step 62, STI regions 14 (see also FIG. 1) are formed in a substrate 10. In step 64, a portion of the substrate 10 is recessed between two of the STI regions 14 (FIG. 2). In step 66, a group III material 16 is formed over a surface of the recessed portion of the substrate 10, the group III material 16 comprising a thickness of about 2 monolayers or less (FIG. 3). In step 68, a group III-V material 18 is grown from the group III material 16 (FIG. 4). And in step 70, a channel material 20 is grown from the group III-V material 18.

Embodiments of the present disclosure include methods of forming semiconductor devices 100, and also include methods of forming FinFETs 24.

Advantages of some embodiments of the present disclosure include providing novel methods of forming seed layers used to form channel materials of transistors that result in improved device performance. The novel about 2 monolayer or less thick group III material improves nucleation on the substrate for growth of the subsequently formed group III/V material. The group III material promotes nucleation of the group III/V material on the substrate surface, for example. The group III/V material is either substantially defect-free, has fewer defects, and/or has a lower defect density, due to the inclusion of the thin group III material in the structure of the semiconductor device 100.

The group III and group III/V materials are formed using selective area growth (SEG) by MOCVD within STI regions in some embodiments. Using a group III material having a thickness of about 2 monolayers or less as a pre-layer advantageously results in an ability to use much lower group V/group III precursor ratios when later forming or growing the group III/V material. Thus, the group III/V material can be nucleated on the substrate without requiring the use of high group V fluxes or precursors, which improves nucleation and also reduces defectivity. The group III material nucleation layer also greatly increases the range of growth conditions usable in forming the group III/V material, allowing the group III/V material to be grown with a lower defect density.

FinFET channel materials grown from the group III/V material have improved carrier mobility and device performance. Channel materials grown from the group III/V material have reduced defects or are substantially defect-free. Furthermore, the methods described herein are easily implemented in semiconductor device and FinFET manufacturing process flows.

In some embodiments, a method of forming a semiconductor device includes forming a group III material over a substrate, the group III material comprising a thickness of about 2 monolayers or less. The method includes forming a group III-V material over the group III material.

In other embodiments, a method of forming a semiconductor device includes forming a polar semiconductor material over a substrate, the substrate comprising a non-polar semiconductor material. Forming the polar semiconductor material comprises forming a first component of the polar semiconductor material over the substrate, the first component comprising a thickness of about 2 monolayers or less. Forming the polar semiconductor material further comprises forming the first component of the polar semiconductor material and a second component of the polar semiconductor material over the first component.

In other embodiments, a method of forming a FinFET includes forming STI regions in a substrate, recessing a portion of the substrate between two of the STI regions, and forming a group III material over a surface of the recessed portion of the substrate. The group III material comprises a thickness of about 2 monolayers or less. The method includes growing a group III-V material from the group III material, and growing a channel material from the group III-V material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method of forming a semiconductor device, the method comprising:
 forming a first layer over a substrate, the first layer comprising a group III material having a thickness of about 2 monolayers or less; and forming a second layer over and in physical contact with the first layer, the second layer comprising a III-V material;

wherein:

a group III component of the III-V material and a group V component of the III-V material are deposited substantially simultaneously; and the group III component of the III-V material is the same as the group III material of the first layer.

2. The method according to claim 1, wherein:

forming the first layer comprises introducing a group III precursor into a chamber; and forming the second layer comprises continuing to introduce the group III precursor into the chamber, and concurrently introducing a group V precursor into the chamber.

3. The method according to claim 2, wherein introducing the group III precursor comprises a flow rate of about 10 standard cubic centimeters per second (sccm) to about 150 sccm, or wherein introducing the group V precursor comprises a flow rate of about 20 sccm to about 500 sccm.

4. The method according to claim 2, wherein introducing the group III precursor comprises introducing a material selected from the group consisting essentially of trimethyl indium (TMIn), triethyl gallium (TEGa), trimethyl gallium (TMGa), trimethyl aluminum (TMAl), tritertiarybutylaluminum (TTBAl), and combinations thereof, or wherein introducing the group V precursor comprises introducing a material selected from the group consisting essentially of tributyl arsenic (TBAs), arsine ($AsH_3$), phosphine ($PH_3$), tributyl phosphorus (TBP), trimethyl antimony (TMSb), triethyl antimony (TESb), and combinations thereof.

5. The method according to claim 2, wherein introducing the group III precursor comprises a time period of about 1 second to about 20 seconds, or wherein introducing the group V precursor comprises a time period of about 5 seconds to about 1,200 seconds.

6. The method according to claim 1, further comprising, before forming the first layer, annealing the substrate at a temperature of about 700 degrees C. to about 725 degrees C. in HCl and $H_2$.

7. The method according to claim 6, further comprising lowering a temperature of the substrate to about 300 degrees C. to about 400 degrees C., after annealing the substrate.

8. The method according to claim 1, further comprising forming a channel material over the III-V material.

9. The method according to claim 8, further comprising, before the step of forming the first layer:

forming shallow trench isolation (STI) regions in the substrate; and recessing a portion of the substrate between two STI regions, and wherein forming the first layer comprises depositing the first layer in the recessed portion of the substrate.

10. The method according to claim 9, further comprising:

recessing the STI regions, wherein a portion of the channel material over top surfaces of remaining portions of the STI regions forms a semiconductor fin;

forming a gate dielectric on sidewalls and a top surface of the semiconductor fin; and forming a gate electrode over the gate dielectric.

11. The method according to claim 8, wherein forming the channel material comprises epitaxially growing the channel material, and wherein the III-V material comprises a seed layer for epitaxial growth of the channel material.

12. A method of forming a semiconductor device, the method comprising:

forming a first layer over a substrate, the substrate comprising a non-polar semiconductor material, wherein forming the first layer comprises depositing a first component of a polar semiconductor material over the substrate, the first layer comprising a thickness of about 2 monolayers or less; and forming a second layer over and in physical contact with the first layer, the second layer comprising:

the first component of the polar semiconductor material of the first layer; and a second component of the polar semiconductor material, wherein the first component of the polar semiconductor material and the second component of the polar semiconductor material are deposited substantially simultaneously.

13. The method according to claim 12, wherein the non-polar semiconductor material comprises Si or Ge.

14. The method according to claim 12, wherein forming the first layer comprises depositing a polar semiconductor material that is at least one of a group III material or a group V material.

15. The method according to claim 12, wherein forming the first layer comprises depositing a group III material, and wherein forming the second layer comprises depositing a III-V material.

16. A method of forming a fin field effect transistor (FinFET), the method comprising:

forming shallow trench isolation (STI) regions in a substrate;

recessing a portion of the substrate between two STI regions;

forming a first layer over a surface of the recessed portion of the substrate, the first layer comprising a group III material, the first layer having a thickness of about 2 monolayers or less;

growing a second layer over and in physical contact with the first layer, the second layer comprising a III-V material, wherein:

a group III component of the III-V material is the same as the group III material of the first layer; and the group III component of the III-V material and a group V component of the III-V material are deposited substantially simultaneously; and growing a third layer over the second layer, wherein the third layer corresponds to a channel, the third layer comprising the III-V material.

17. The method according to claim 16, further comprising:

recessing the STI regions, wherein a portion of the third layer disposed above top surfaces of remaining portions of the STI regions forms a semiconductor fin;

forming a gate dielectric on sidewalls and a top surface of the semiconductor fin; and forming a gate electrode over the gate dielectric.

18. The method according to claim 16, wherein forming the first layer comprises forming a nucleation layer.

19. The method according to claim 16, wherein forming the first layer comprises forming Ga, In, or Al.

20. The method according to claim 16, wherein forming the first layer comprises introducing a group III precursor at a flow rate of about 10 standard cubic centimeters per second (sccm) to about 150 sccm for a time period of about 1 second to about 20 seconds.

* * * * *